United States Patent
Carrillo et al.

(10) Patent No.: US 7,315,803 B1
(45) Date of Patent: Jan. 1, 2008

(54) VERIFICATION ENVIRONMENT CREATION INFRASTRUCTURE FOR BUS-BASED SYSTEMS AND MODULES

(75) Inventors: Jorge Ernesto Carrillo, San Jose, CA (US); Paulo Luis Dutra, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 364 days.

(21) Appl. No.: 11/055,275

(22) Filed: Feb. 10, 2005

(51) Int. Cl.
*G06F 17/50* (2006.01)
*G06F 9/455* (2006.01)

(52) U.S. Cl. .................. 703/14; 703/22; 703/27; 716/5; 716/18

(58) Field of Classification Search .............. 703/14, 703/22, 27; 716/1, 5, 18; 717/165
See application file for complete search history.

(56) References Cited

U.S. PATENT DOCUMENTS

| | | | | |
|---|---|---|---|---|
| 4,885,684 A | * | 12/1989 | Austin et al. ............. | 717/149 |
| 6,425,116 B1 | * | 7/2002 | Duboc et al. ............. | 716/18 |
| 7,124,376 B2 | * | 10/2006 | Zaidi et al. ............. | 716/1 |
| 7,137,087 B1 | * | 11/2006 | Mohanty et al. .......... | 716/5 |
| 2002/0038401 A1 | * | 3/2002 | Zaidi et al. ............. | 710/305 |
| 2002/0091911 A1 | * | 7/2002 | Leijten et al. ............ | 712/35 |
| 2003/0167144 A1 | * | 9/2003 | Wang et al. ............. | 702/119 |
| 2004/0117168 A1 | * | 6/2004 | Neifert et al. ............ | 703/14 |
| 2005/0165597 A1 | * | 7/2005 | Nightingale ............. | 703/27 |
| 2005/0229170 A1 | * | 10/2005 | Bellantoni et al. ......... | 717/165 |

* cited by examiner

*Primary Examiner*—Thai Phan
(74) *Attorney, Agent, or Firm*—Kevin T. Cuenot

(57) ABSTRACT

A method of building a verification environment within a software-based development tool for a programmable logic device can include determining an interface description for a bus functional model. The method further can include creating a hardware specification for the programmable logic device. The hardware specification can reference the bus functional model and at least one bus-based module interacting with the bus functional model. The verification environment for the programmable logic device can be automatically generated according to the interface description and the hardware specification.

20 Claims, 2 Drawing Sheets

VERIFICATION ENVIRONMENT CREATION INFRASTRUCTURE FOR BUS-BASED SYSTEMS AND MODULES

COPYRIGHT NOTICE

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND

1. Field of the Invention

This invention relates to the field of electronic circuit design and, more particularly, to testing and verifying electronic circuit designs having one or more bus interconnects.

2. Description of the Related Art

The design of an electrical circuit, and particularly a programmable logic device (PLD), involves a significant amount of testing and verification to ensure that the resulting circuit functions within expected tolerances. Typically, a PLD is specified and designed using a hardware description language (HDL). When a circuit such as a PLD is to include a bus interconnect, testing and verification become even more complex.

In general, PLD designs including bus interconnects are tested using one of two different techniques. The first is to create a test bench, also referred to as a verification environment. A test bench refers to HDL descriptions that specify and verify the behavior of the electrical circuit. Generating a test bench involves describing the connections, events, and test vectors for different combinations of bus transactions. Events and data in electrical circuits are routinely described by signals, which are one bit wide, and vectors, which are two or more bits wide.

An HDL simulator is used to execute the test bench so that changes to signals and vectors over time can be observed. The simulator allows developers to visualize the logical and physical conditions that influence the behavior of the PLD. The simulator effectively tests the various logical and physical conditions that influence the behavior and proper functioning of the circuit.

Test benches are manually coded by a developer. Accordingly, despite the simulation benefits, test bench development tends to be a time consuming and error-prone process. Further, as the circuit design continues to evolve, the test bench also must be modified in accordance with the changes to the circuit design. In consequence, the maintenance of a test bench can be as time consuming and tedious a process as first developing the test bench.

The second technique for testing a PLD having a bus interconnect has been to create a larger system with other "known-to-work" components. Components that have already been tested and verified can be incorporated into a PLD design and configured to create or respond to bus transactions thereby interacting with bused components of the design. This solution, however, also has disadvantages.

In particular, using known-to-work components requires not only describing the connections of the bused components, but also programming the known components that will interact with the bused components. Essentially, developers must recreate the known components within a third-party development environment that is specifically tailored for testing bused components. The known components are reprogrammed within the third-party development environment to generate desired transactions and to respond to transactions originating from the bused components. This process also involves manually creating, compiling, and storing code so that components can access the code during execution to generate appropriate responses.

It would be beneficial to have an architecture and methodology that is less susceptible to error and overcomes the disadvantages described above.

SUMMARY OF THE INVENTION

The present invention provides a method, system, and apparatus relating to the automatic creation of verification environments for bus-based systems and/or modules. According to one embodiment of the present invention, a method of building a verification environment within a software-based development tool for a PLD can include determining an interface description for a bus functional model. A hardware specification for the PLD can be created. The hardware specification can reference the bus functional model and at least one bus-based module interacting with the bus functional model. The method also can include automatically generating the verification environment for the PLD according to the interface description and the hardware specification.

In another embodiment of the present invention, a capture utility of the development tool can be used to automatically generate the interface description for the bus functional model. The bus functional model can be a software component that is foreign to the development tool. A connectivity component of the development tool can be used to create the hardware specification. The verification environment can be executed by an HDL simulation engine. The method further can include compiling the bus functional model to generate at least one command script and executing the verification environment within the development tool according to the command script.

Other embodiments of the present invention can include a machine readable storage that has been programmed to cause a machine to perform the steps disclosed herein as well as a system having means for performing the various steps described herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for automating the process of creating verification environments for PLD designs. In accordance with the inventive arrangements disclosed herein, a PLD design which includes one or more bus interconnects can be evaluated within a development tool configured for testing and/or verifying PLD's. Bus functional models (BFM's) can be incorporated into a verification environment that can be automatically generated by the development tool. A BFM is a software construct that models the functionality of a bus interface.

The present invention facilitates faster and more efficient testing and/or verification of bus-based PLD components from within a single verification environment. As used herein, a bus-based component or a bused-component is one that is included within a PLD and is intended to communicate through a communications bus also disposed within the PLD. As such, a software representation of the bus-based component interacts with a BFM within a simulation environment.

Figure 1:
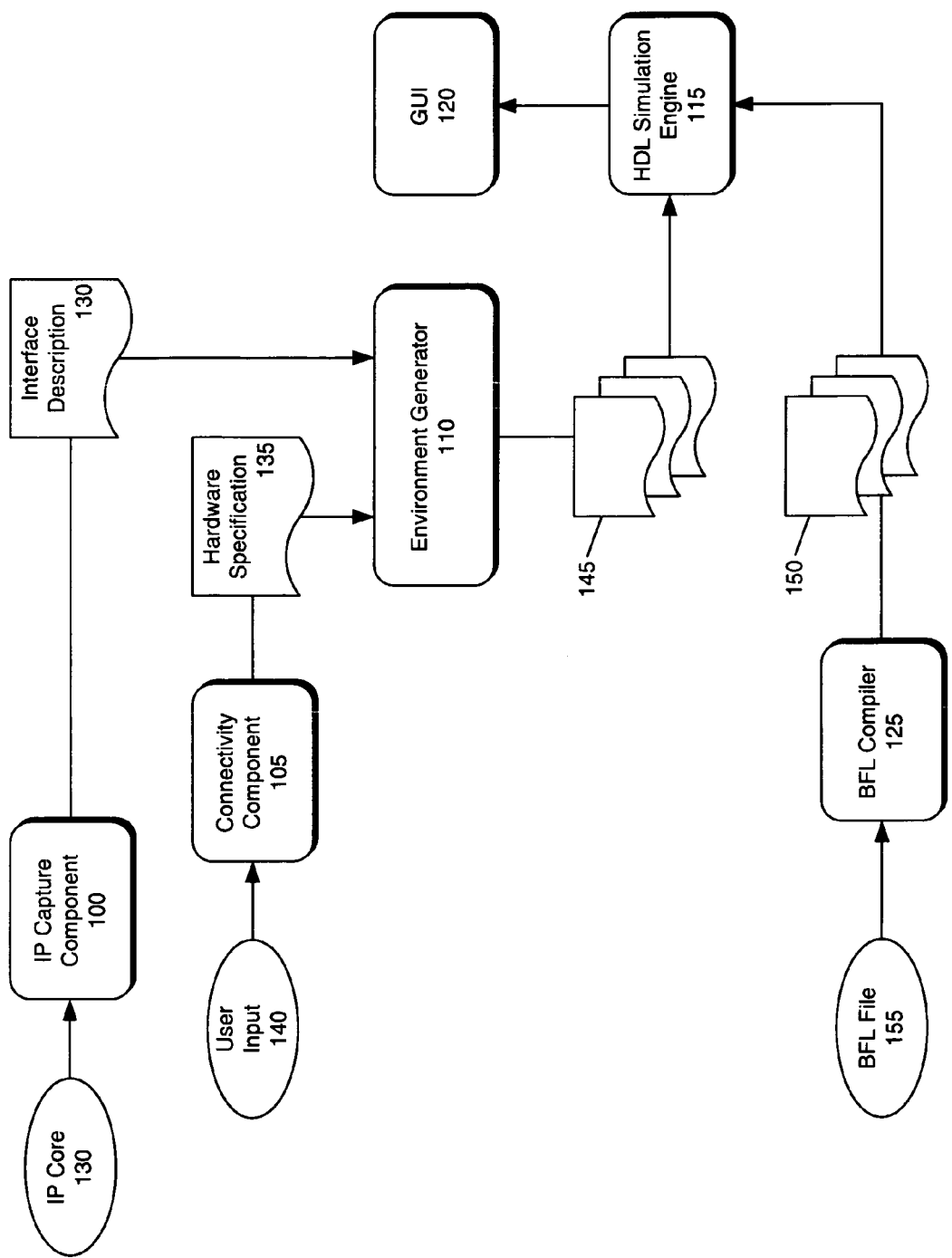
FIG. 1 is a schematic diagram illustrating a system for testing and/or verifying PLD designs which include bus interconnects in accordance with one embodiment of the present invention.

FIG. 1 is a schematic diagram illustrating a system for verifying and/or testing PLD designs which include bus interconnects in accordance with one embodiment of the present invention. The system of FIG. 1 depicts an infrastructure for a software-based tool for testing and/or verification of PLD designs. As shown, the system can include an Intellectual Property (IP) capture component 100, a connectivity component 105, and an environment generator 110. Also included can be an HDL simulation engine 115 and a graphical user interface (GUI) 120. A bus functional language (BFL) compiler 125 can be included within the system or can be provided from another interoperable development kit.

According to one embodiment of the present invention, the system can be implemented as the Xilinx Platform Studio Embedded Development Kit (Platform Studio), which is available from Xilinx, Inc. of San Jose, Calif. Platform Studio is a series of software-based tools for designing embedded programmable systems. Platform Studio supports designs of processor sub-systems which utilize the IBM PowerPC™ hard processor core available from International Business Machines Corporation (IBM) of Armonk, N.Y. and/or the Xilinx MicroBlaze™ soft processor core available from Xilinx, Inc.

The IP capture component 100 can process an IP core 130 that is not included or offered as part of the system of FIG. 1. The IP capture component 100 can process IP core 130 and generate an IP core that is compliant with the system. In other words, the IP capture component 100 provides, as output, an interface description 135, which is a file describing the interface to IP core 130.

In an embodiment where the system is implemented as Platform Studio, the IP capture component 100 can be implemented as the Platform Specification Utility (PsfUtil) tool. The PsfUtil tool enables automatic generation of the interface description 130, which also can be referred to as a microprocessor peripheral description (MPD) file. The MPD file is needed by the environment generator 110 for creating an IP core that is compliant with Platform Studio. An example of an interface description file for an IP core is shown in Table 1.

TABLE 1

Example of Interface Description File

BEGIN opb_device_bfm
Peripheral Options
OPTION IPTYPE = PERIPHERAL
OPTION HDL = VHDL
Bus Interfaces
BUS_INTERFACE BUS=MSOPB, BUS_STD=OPB, BUS_TYPE=MASTER_SLAVE
Generics (VHDL)/Parameters (Verilog)

TABLE 1-continued

Example of Interface Description File

PARAMETER NAME = OPB_DEVICE, DT=STRING
PARAMETER MASTER_ADDR_LO_0=0x00000000, DT = std_logic_vector(0 to 31)
PARAMETER MASTER_ADDR_HI_0=0x00000000, DT = std_logic_vector(0 to 31)
PARAMETER SLAVE_ADDR_LO_0 = 0x00000000, DT = std_logic_vector(0 to 31), BUS = MSOPB, ADDRESS = BASE, PAIR = SLAVE_ADDR_HI_0
PARAMETER SLAVE_ADDR_HI_0 = 0x00000000, DT = std_logic_vector(0 to31) BUS = MSOPB, ADDRESS = HIGH, PAIR = SLAVE_ADDR_LO_0
Ports
PORT SYNCH_OUT = "", DIR =0, VEC=[0:31]
PORT SYNCH_IN = "", DIR = I, VEC=[0:31]
PORT OPB_CLK = "", DIR = I, BUS = MSOPB
PORT OPB_RESET = OPB_Rst, DIR = I, BUS = MSOPB
PORT OPB_MGRANT = OPB_MGrant, DIR = I, BUS = MSOPB
PORT OPB_BE = OPB BE, DIR=I, VEC=[0:3], BUS = MSOPB
. . .
END An IP core is a block of logic or data that can be used in making a PLD, such as a field programmable gate array (FPGA) or an application-specific integrated circuit (ASIC). IP cores facilitate design reuse and design automation. In accordance with one embodiment of the present invention, IP core 130 can be a soft core, which can be implemented as a netlist or as HDL code.

In one embodiment of the present invention, IP core 130 can be a BFM. A BFM is a software construct that models the functionality of a bus interface to generate stimuli or respond to bus transactions. BFM's are available from a number of different third party providers. IBM, for example, provides the CoreConnect™ bus architecture, which is an on-chip bus standard that facilitates integration and reuse of processor, system, and peripheral cores within standard product and custom system-on-a-chip designs. BFM's are provided as part of the toolkit for the CoreConnect™ bus architecture.

The connectivity component 105 generates a hardware specification 135 that defines a hardware environment or platform. The hardware platform of a PLD can include one or more processors and peripherals connected to the processor buses. The hardware specification 135 defines the system architecture, peripherals, and embedded processors. The hardware specification 135 also defines the connectivity of the system, the address map of each peripheral in the system, and configurable options for each peripheral. Multiple processor instances connected to one or more peripherals through one or more buses and bridges also can be specified in the hardware specification 135.

In the embodiment where the system is implemented as Platform Studio, the connectivity component 105 can be implemented as the Base System Builder (BSB) which is a software tool that aids users in building a working system targeted to a specific development board. The BSB can create the hardware specification 135, referred to as an MHS file, and a software specification, referred to as an MSS file. The MHS file is a simple text file. Though any text editor can be used to create the MHS file, Platform Studio provides an editor as well as graphical means, such as GUI 120, to create and/or edit MHS files based upon user input 140. An example of a hardware specification is shown in Table 2.

TABLE 2

Example of Hardware Specification

```
# Parameters
PARAMETER VERSION = 2.1.0
# Top Level ports
PORT sys_reset=sys_reset, DIR=IN
PORT sys_clk=sys_clk, DIR=IN, Sigis=CLK
# Components
BEGIN opb_device bfm
    PARAMETER INSTANCE = my_master
    PARAMETER HW_VER = 1.00.a
    PORT SYNCH_IN = synch
    PORT SYNCH_OUT = synch0
    BUS_INTERFACE MSOPB = opb_bus
END
BEGIN opb_monitor_bfm
    PARAMETER INSTANCE = my_monitor
    PARAMETER HW_VER = 1.00.a
    PORT OPB_Clk = sys_clk
    PORT SYNCH_IN = synch
    PORT SYNCH_OUT = synch1
    BUS_INTERFACE MON_OPB = opb_bus
END
BEGIN bfm_synch
    PARAMETER INSTANCE = my_synch
    PARAMETER HW_VER = 1.00.a
    PARAMETER C_NUM_SYNCH = 2
    PORT FROM_SYNCH_OUT = synch0 & synch1
    PORT TO_SYNCH_IN = synch
END
BEGIN opb_v20
    PARAMETER INSTANCE = opb_bus
    PARAMETER HW_VER = 1.10.b
    PORT SYS_Rst = sys_reset
    PORT OPB_Clk = sys_clk
END
BEGIN opb_dut
    PARAMETER INSTANCE = my_dut
    PARAMETER HW_VER = 1.00.a
    PARAMETER C_BASEADDR = 0xffff0100
    PARAMETER C_HIGHADDR = 0xffff01ff
    BUS_INTERFACE SOPB = opb_bus
END
```

The environment generator 110 can receive the interface description 130 and the hardware specification 135 as input. The environment generator 110 effectively reads the input and automatically generates one or more hardware description language (HDL), for example, Verilog or VHDL, files as output. The HDL file output specifies a verification environment 145 that can be executed within the HDL simulation engine 115. The resulting verification environment 145 can specify bus interconnects. Within Platform Studio, for example, the Simulation Model Generator (SimGen) can function as the environment generator 110. SimGen can create and configure various VHDL and Verilog simulation models for specified hardware. SimGen receives as input an MHS file, which describes instantiations and connections of hardware components.

After the verification environment 145 is created, a developer can configure the IP module 130, in this case a BFM, to generate and/or respond to bus transactions. The IP core 130 can be configured using a BFL file 155 that configures the on-chip peripheral bus (opb) device to generate read and write bus transactions. An example of a BFL file is shown in Table 3.

TABLE 3

Example BFL File

```
-- Initialize my_master
set_device (path=/system/my_master/my_master/device,
    device_type=opb_device)
-- Write and read 32-bit data
write(addr=ffff0100, be=1111, data=01020304)
write(addr=ffff0104, be=1111, data=05060708)
read(addr=ffff0100, be=1111, data=01020304)
read(addr=ffff0104, be=1111, data=05060708)
-- Write and read 16-bit data
write(addr=ffff0100, be=1100, data=01020102)
write(addr=ffff0102, be=00111, data=03040304)
read(addr=ffff0100, be=1100, data=01020102)
read(addr=ffff0102, be=0011, data=03040304)
-- Write and read 8-bit data
write(addr=ffff0100, be=1000, data=01010101)
write(addr=ffff0101, be=0100, data=02020202)
read(addr=ffff0100, be=1000, data=01010101)
read(addr=ffff0101, be=0100, data=02020202)
```

The BFL file 155 is compiled using the BFL compiler 125. One such BFL compiler is provided as part of the toolkit for the CoreConnect™ bus architecture. The BFL compiler 130 generates hardware simulator specific command scripts 150 that can be executed at runtime in the HDL simulation engine 115. The HDL simulation engine 115 can receive scripts 150 and verification environment 145. The verification environment 145 can be executed by the HDL simulation engine 115 using scripts 150 as shown. Results and further interactions between the developer and the system of FIG. 1 can be handled through the GUI 120.

It should be appreciated that the toolkits and development environments noted herein have been provided for purposes of illustration. As such, the particular examples disclosed herein are not intended to limit the scope of the present invention. Rather, any suitable development kit or component that functions substantially as described herein can be used.

Figure 2:
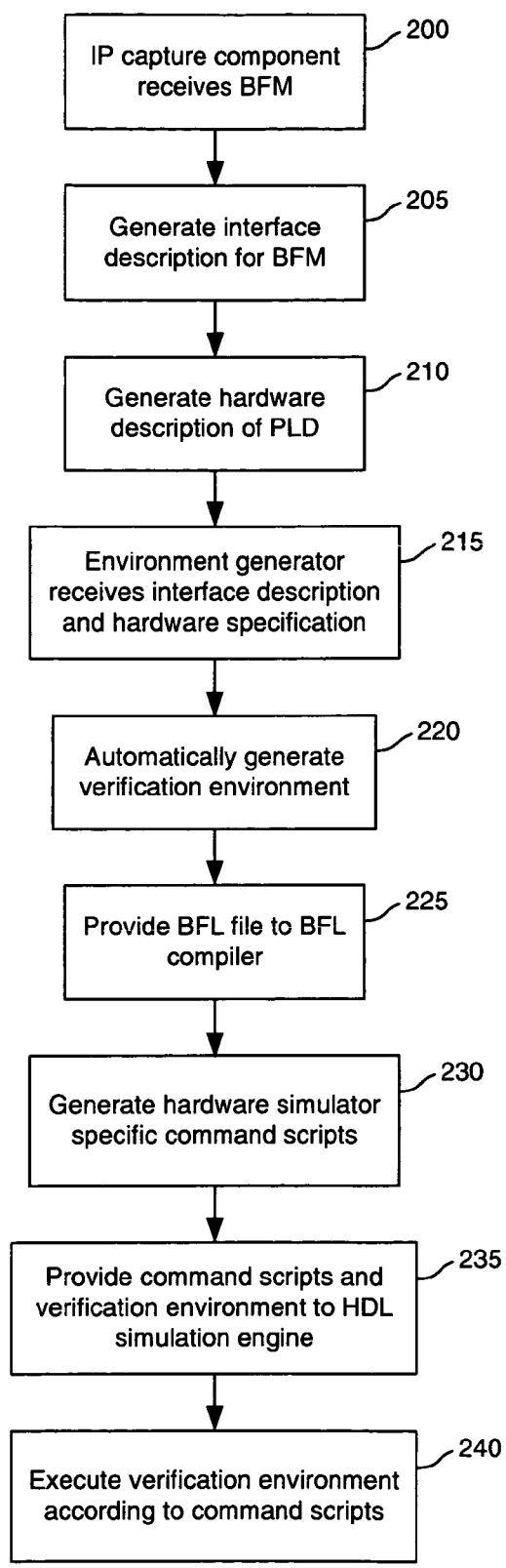
FIG. 2 is a flow chart illustrating a method of testing and/or verifying PLD designs including bus interconnects in accordance with another embodiment of the present invention.

FIG. 2 is a flow chart illustrating a method of testing and/or verifying PLD designs including bus interconnects in accordance with another embodiment of the present invention. The method of FIG. 2 can be performed by a PLD development tool such as the one described with reference to FIG. 1.

The method can begin in step 200, where a BFM can be received by the IP capture component of the development tool. The BFM can be one that is foreign to, or not available from within, the development tool. That is, the BFM can be provided by a different manufacturer than that of the development tool. In step 205, the IP capture component can automatically generate an interface description for the BFM. The interface description specifies the interface of the BFM. As such, the interface description can list ports and default connectivity for the BFM as well as default values.

In step 210, a hardware specification can be generated by a connectivity component of the development tool based upon received user inputs. The hardware specification can define the PLD, i.e. the hardware description of the system on a chip. As noted, the hardware specification can define the embedded processor system and include the connectivity and system topology. The hardware specification can include, or reference, one or more BFM's and one or more bus-based components that interface with the BFM's. It should be appreciated that default parameters and/or port assignments of the interface description can be overwritten with values specified in the hardware specification.

In step 215, the environment generator can receive the interface description and the hardware specification. The environment generator automatically generates a verification environment in step 220. The verification environment is formed of a set of HDL files that instantiate any specified modules and describe the connections between the modules. The development tool effectively creates a customized HDL verification environment that is based upon the hardware specification. This relieves the developer from having to manually edit complex bus interface files.

In step 225, a BFL can be provided to a BFL compiler. The BFL compiler can be included as part of the development tool or can be provided from a third party provider. In any case, the BFL compiler, in step 230, generates one or more hardware simulator specific command scripts from the BFL file. These command scripts are used to drive the BFM's at simulation runtime.

In step 235, the command scripts and the verification environment are provided to the HDL simulation engine of the development tool. The HDL simulation engine can execute the verification environment in accordance with the command scripts in step 240. The command scripts provide the input and output for the BFM's specified by the verification environment. Simulation results can be presented through the GUI component of the development tool.

The present invention provides a solution for testing and verifying PLD designs which incorporate bus connections. In accordance with the inventive arrangements disclosed herein, BFM's from third party manufacturers can be incorporated into verification environments to be executed within a PLD development tool. The verification environments can be automatically generated by the development tool thereby relieving developers from manually editing complex bus interface files.

The present invention further allows developers to test various aspects of PLD's within the PLD development tool without having to utilize development kits configured specifically for BFM's. Developers can work within a single, unified PLD development environment to test and/or verify PLD designs including bus-based components. By working within a single, unified environment, the need to recreate PLD components within a separate BFM development tool for testing purposes is reduced or eliminated.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the (computer system such that it carries out the methods described herein.

The present invention also can be embedded in a computer program product, which comprises all the features enabling the implementation of the methods described herein, and which when loaded in a computer system is able to carry out these methods. Computer program or software, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. Within a software-based development tool for a programmable logic device, a method of building a verification environment comprising:
   automatically determining an interface description for a bus functional model, wherein the bus functional model represents an on-chip bus interface to a processor embedded on the programmable logic device and specifies a bus type;
   creating a hardware specification for the programmable logic device, wherein the hardware specification references the bus functional model and at least one bus-based module interacting with the bus functional model; and
   automatically generating the verification environment for the programmable logic device according to the interface description and the hardware specification, wherein the verification environment specifies bus interconnects of the bus functional model and the at least one bus-based module.

2. The method of claim 1, said determining step comprising using a capture utility of the development tool to automatically generate the interface description for the bus functional model.

3. The method of claim 1, wherein the bus functional model is a software component that is foreign to the development tool.

4. The method of claim 1, said creating step comprising using a connectivity component of the development tool to create the hardware specification.

5. The method of claim 1, wherein the verification environment is executed by a hardware description language simulation engine.

6. The method of claim 1, further comprising compiling a bus functional language file to generate at least one command script.

7. The method of claim 6, further comprising executing the verification environment within the development tool according to the command script.

8. A system for constructing a verification environment for a programmable logic device having a bus interface, said system comprising:
   means for automatically determining an interface description for a bus functional model, wherein the bus functional model represents an on-chip bus interface to a processor embedded on the programmable logic device and specifies a bus type;
   means for creating a hardware specification for the programmable logic device, wherein the hardware specification references the bus functional model and at least one bus-based module interacting with the bus functional model; and
   means for automatically generating the verification environment for the programmable logic device according to the interface description and the hardware specification, wherein the verification environment specifies bus interconnects of the bus functional model and the at least one bus-based module.

9. The system of claim 8, said means for determining further comprising a capture utility that automatically generates the interface description for the bus functional model.

10. The system of claim 8, wherein the bus functional model is a software component that is foreign to the system.

11. The system of claim 8, said means for creating further comprising a connectivity component that creates the hardware specification.

12. The system of claim 8, further comprising a hardware description language simulation engine configured to execute the verification environment.

13. The system of claim 8, further comprising means for compiling a bus functional language file to generate at least one command script.

14. The system of claim 13, further comprising means for executing the verification environment according to the command script.

15. A machine readable storage, having stored thereon a computer program having a plurality of code sections executable by a machine for causing the machine to perform the steps of:
automatically determining an interface description for a bus functional model, wherein the bus functional model represents an on-chip bus interface to a processor embedded on the programmable logic device and specifies a bus type;
creating a hardware specification for a programmable logic device, wherein the hardware specification references the bus functional model and at least one bus-based module interacting with the bus functional model; and
automatically generating the verification environment for the programmable logic device according to the interface description and the hardware specification, wherein the verification environment specifies bus interconnects of the bus functional model and the at least one bus-based module.

16. The machine readable storage of claim 15, said determining step comprising using a capture utility to automatically generate the interface description for the bus functional model.

17. The machine readable storage of claim 15, wherein the verification environment is generated by a software-based development tool and the bus functional model is a software component that is foreign to the development tool.

18. The machine readable storage of claim 15, said creating step comprising using a connectivity component to create the hardware specification for the verification environment.

19. The machine readable storage of claim 15, further comprising compiling the bus functional language file to generate at least one command script.

20. The machine readable storage of claim 19, further comprising executing the verification environment according to the command script.

* * * * *